(12) United States Patent
Yun et al.

(10) Patent No.: US 10,088,521 B2
(45) Date of Patent: Oct. 2, 2018

(54) TEST BOARD FOR SEMICONDUCTOR PACKAGE, TEST SYSTEM, AND METHOD OF MANUFACTURING SEMICONDUCTOR PACKAGE

(71) Applicant: SAMSUNG ELECTRONICS CO., LTD., Suwon-si (KR)

(72) Inventors: Joo-sung Yun, Asan-si (KR); Woon-sup Choi, Asan-si (KR); Moon-ho Lee, Asan-si (KR); Seong-seob Shin, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/455,550

(22) Filed: Mar. 10, 2017

(65) Prior Publication Data

US 2018/0031629 A1 Feb. 1, 2018

(30) Foreign Application Priority Data

Jul. 27, 2016 (KR) ........................ 10-2016-0095491

(51) Int. Cl.
| H01L 23/58 | (2006.01) |
| G06F 19/00 | (2018.01) |
| G01R 31/302 | (2006.01) |
| H02J 7/02 | (2016.01) |
| H01L 21/66 | (2006.01) |
| G01R 1/04 | (2006.01) |

(52) U.S. Cl.
CPC ....... *G01R 31/3025* (2013.01); *G01R 1/0433* (2013.01); *H01L 22/14* (2013.01); *H02J 7/025* (2013.01)

(58) Field of Classification Search
CPC .... H01L 22/14; G01R 31/3025; G01R 1/0433
USPC .............................................. 702/122; 438/15
See application file for complete search history.

(56) References Cited

U.S. PATENT DOCUMENTS

| 6,883,128 B2 | 4/2005 | Kang et al. |
| 7,607,056 B2 | 10/2009 | Kang et al. |
| 8,125,236 B2 | 2/2012 | Lee et al. |
| 9,325,435 B2 * | 4/2016 | Olgaard .............. H04B 17/309 |
| 2005/0237073 A1 * | 10/2005 | Miller ................ G01R 1/07385 |
| | | 324/756.03 |

(Continued)

FOREIGN PATENT DOCUMENTS

| JP | 2015-1430 A | 1/2015 | |
| JP | 2015001430 A * | 1/2015 | ............. G01R 31/28 |

(Continued)

*Primary Examiner* — David S Blum
(74) *Attorney, Agent, or Firm* — Sughrue Mion, PLLC

(57) ABSTRACT

A test board includes: a board substrate; a device under test (DUT) socket connected to the board substrate and configured to accommodate a semiconductor package; a test controller; a wireless signal unit configured to wirelessly exchange signals with a server; and a wireless power unit configured to be wirelessly charged by an external source and configured to supply electric power to the test controller and the DUT socket, wherein the test controller is configured to independently perform a test on the semiconductor package accommodated in the DUT socket in response to a test pattern command being wirelessly received from the server via the wireless signal unit.

22 Claims, 13 Drawing Sheets

(56) References Cited

U.S. PATENT DOCUMENTS

| | | | |
|---|---|---|---|
| 2006/0132161 A1* | 6/2006 | Khandros | G01R 31/2884 324/762.05 |
| 2009/0066356 A1* | 3/2009 | Slupsky | G01R 1/07 324/754.31 |
| 2013/0111283 A1 | 5/2013 | Zhang et al. | |
| 2014/0002121 A1* | 1/2014 | Khoche | H01L 22/14 324/750.3 |
| 2014/0236525 A1 | 8/2014 | Chan et al. | |
| 2014/0237292 A1 | 8/2014 | Chan et al. | |
| 2015/0219688 A1 | 8/2015 | Jeon et al. | |
| 2018/0011250 A1* | 1/2018 | Fortier | G02B 6/13 |
| 2018/0031606 A1* | 2/2018 | Isaac | G01R 1/24 |

FOREIGN PATENT DOCUMENTS

| | | |
|---|---|---|
| KR | 10-0471544 B1 | 3/2005 |
| KR | 10-0916209 B1 | 9/2009 |
| KR | 10-1023426 B1 | 3/2011 |
| KR | 10-1534163 B1 | 7/2015 |
| KR | 10-2015-0119869 A | 10/2015 |
| KR | 10-2015-0126364 A | 11/2015 |
| KR | 10-2016-0059526 A | 5/2016 |

* cited by examiner

TEST BOARD FOR SEMICONDUCTOR PACKAGE, TEST SYSTEM, AND METHOD OF MANUFACTURING SEMICONDUCTOR PACKAGE

CROSS-REFERENCE TO RELATED APPLICATION

This application claims priority from Korean Patent Application No. 10-2016-0095491, filed on Jul. 27, 2016, in the Korean Intellectual Property Office, the disclosure of which is incorporated herein by reference in its entirety.

BACKGROUND

1. Field

Example embodiments of the inventive concept relate to a test board for a semiconductor package, a test system, and a method of manufacturing a semiconductor package, and more particularly, to a test board for a device under test (DUT), a test system, and a method of manufacturing a semiconductor package by using the test board and the test system.

2. Description of the Related Art

According to the rapid development of electronics industry and the market demand, electronic apparatuses have been required to be smaller, to have higher performance, and to have improved performance. Accordingly, a test for a semiconductor package included in an electronic apparatus has become complicated. To shorten a test time of a semiconductor package, the size of equipment for testing a semiconductor package has been increased.

SUMMARY

One or more example embodiments of the present inventive concept provide a test board and test system for a semiconductor package, which may efficiently test a semiconductor package.

One or more example embodiments of the present inventive concept also provide a method of manufacturing a semiconductor package including an operation of efficiently testing a semiconductor package.

According to an aspect of the inventive concept, there is provided a test board including: a board substrate, a device under test (DUT) socket connected to the board substrate and accommodating a semiconductor package, a test controller attached to one surface of the board substrate, a wireless signal unit wirelessly exchanging signals with a server, and a wireless power unit wirelessly charged and supplying electric power to the test controller and the DUT socket, wherein the test controller independently performs a test on the semiconductor package accommodated in the DUT socket in response to a test pattern command wirelessly received from the server via the wireless signal unit.

According to another aspect of the inventive concept, there is provided a test system including: a server, and a plurality of test boards wirelessly exchanging signals with the server, wherein each of the plurality of test boards includes a device under test (DUT) socket accommodating a semiconductor package, a test controller independently performing a test on the semiconductor package accommodated in the DUT socket in response to a test pattern command wirelessly received from the server, and a wireless power unit wirelessly charged and supplying electric power to the test controller and the DUT socket.

According to another aspect of the inventive concept, there is provided a method of manufacturing a semiconductor package, the method including: manufacturing a plurality of semiconductor packages, and performing a test on each of the plurality of semiconductor packages, wherein the performing of the test includes preparing a plurality of test boards, each of the plurality of test boards including a device under test (DUT) socket, a test controller, a wireless signal unit, and a wireless power unit that is wirelessly charged, supplies electric power to the test controller and the DUT socket, and having a secondary battery, accommodating the plurality of semiconductor packages in the DUT sockets of the plurality of test boards, and independently performing a test on the semiconductor package accommodated in the DUT socket, in response to a test pattern command wirelessly received from a server via the wireless signal unit.

According to another aspect of the inventive concept, there is provided a test board including: a board substrate; a device under test (DUT) socket connected to the board substrate and configured to accommodate a semiconductor package; a test controller; a wireless signal unit configured to wirelessly exchange signals with a server; and a wireless power unit configured to be wirelessly charged by an external source and configured to supply electric power to the test controller and the DUT socket, wherein the test controller is configured to independently perform a test on the semiconductor package accommodated in the DUT socket in response to a test pattern command being wirelessly received from the server via the wireless signal unit.

According to another aspect of the inventive concept, there is provided a test system including: a server; and a plurality of test boards configured to wirelessly exchange signals with the server, wherein each of the plurality of test boards includes: a device under test (DUT) socket configured to accommodate a semiconductor package; a test controller configured to independently perform a test on the semiconductor package accommodated in the DUT socket in response to a test pattern command being wirelessly received from the server; and a wireless power unit configured to be wirelessly charged by an external source and configured to supply electric power to the test controller and the DUT socket.

According to another aspect of the inventive concept, there is provided a method of manufacturing a semiconductor package including: manufacturing a plurality of semiconductor packages; and performing a test on each of the plurality of semiconductor packages, wherein the performing the test includes: preparing a plurality of test boards, each of the plurality of test boards including: a device under test (DUT) socket; a test controller; a wireless signal unit; and a wireless power unit that is wirelessly charged, that supplies electric power to the test controller and the DUT socket, and that includes a secondary battery; accommodating the plurality of semiconductor packages in the DUT sockets of the plurality of test boards; and independently performing the test on each semiconductor package accommodated in the DUT socket, in response to a test pattern command being wirelessly received from a server via the wireless signal unit.

According to another aspect of the inventive concept, there is provided a test system including: a test board including: a board substrate; a wireless signal transceiver and a power storage and supply unit provided on a first side of the board substrate; and a power receiver provided on a second side opposite of the first side of the board substrate;

and a power supply unit configured to charge the power storage and supply unit provided on the test board and including: a power generator; and a power transmitter, wherein the test board is provided on the power transmitter.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Example embodiments of the present inventive concept will now be described more fully with reference to the accompanying drawings, in which embodiments of the inventive concept are shown.

In the exemplary embodiment of the present disclosure, a "unit" performs at least one function or operation, and may be implemented with hardware, software, or a combination of hardware and software. In addition, a plurality of "units" may be integrated into at least one module except for a "module" or a "unit" which has to be implemented with specific hardware, and may be implemented with at least one processor (not shown).

Figure 1:
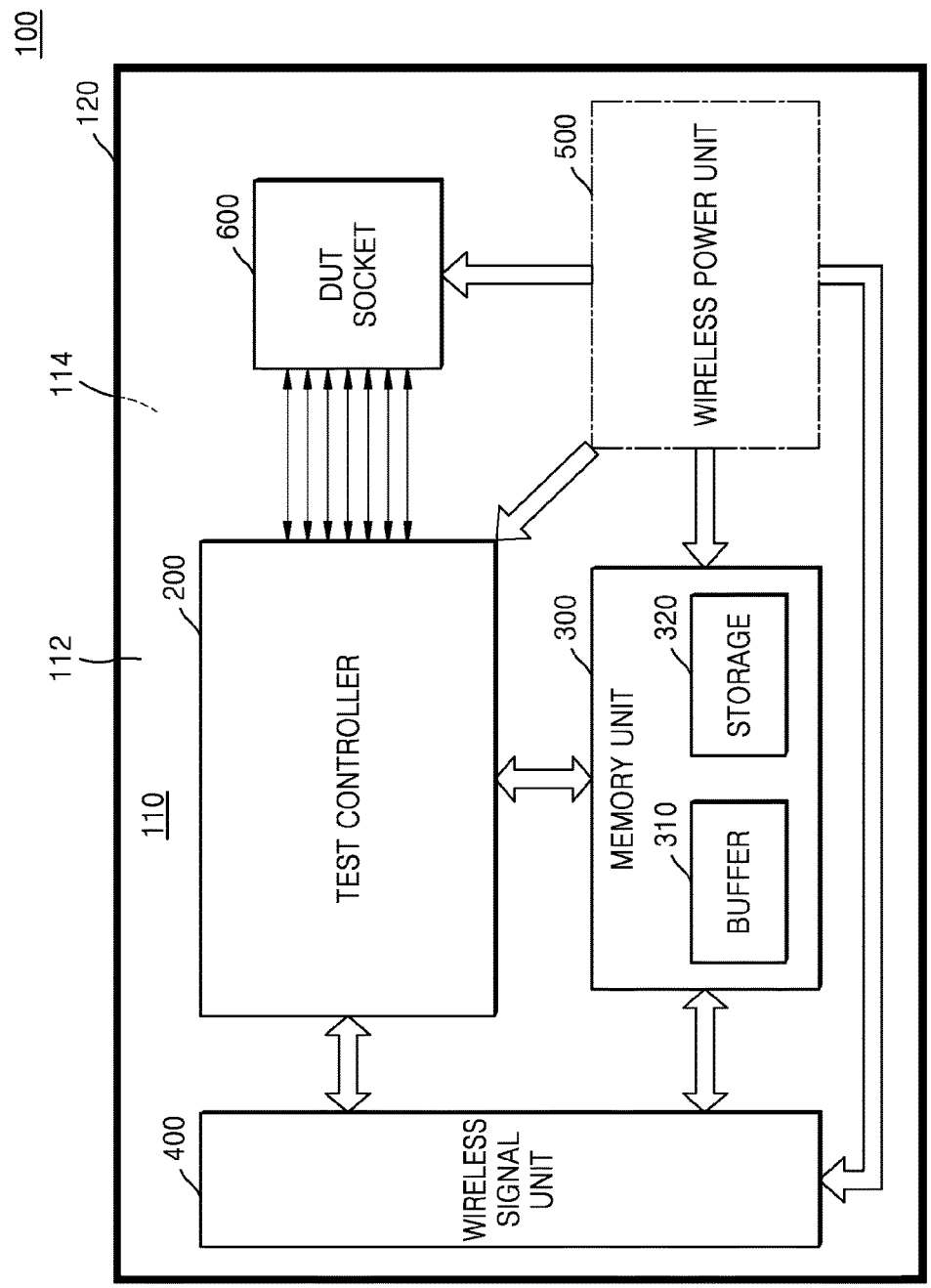
FIG. 1 is a block diagram illustrating a test board according to an example embodiment.

FIG. 1 is a block diagram illustrating a test board 100 according to an example embodiment.

Referring to FIG. 1, the test board 100 for testing a semiconductor package may include a test controller 200, a wireless signal unit 400, a wireless power unit 500, and a device under test (DUT) socket 600. The test board 100 may further include a memory unit 300. In FIG. 1, the memory unit 300 is indicated as a separate unit from the test controller 200. However, the example embodiment is not limited thereto. For example, part of or the whole of the memory unit 300 may be included in the test controller 200. Also, some elements or all elements constituting the wireless signal unit 400 and/or the wireless power unit 500 may be included in the test controller 200.

The test controller 200 may be formed of, for example, a single semiconductor chip such as a field programmable gate array (FPGA), an application specific integrated circuit (ASIC), and an application processor (AP). Alternatively, the test controller 200 may be formed by using a FPGA of Xilinx, Altera, Lattice Semiconductor, Microsemi, Achronix, QuickLogic, e2v, or Atmel.

The test controller 200 may communicate with the DUT socket 600 and may independently perform a test on a semiconductor package accommodated in the DUT socket 600. For example, the test controller 200 and the DUT socket 600 may communicate with each other by using a serial type protocol or a parallel type protocol.

The test controller 200 may process data and/or analyze and execute commands. A test program executed by the test controller 200 may perform a functional test including inputting a signal generated by an algorithmic pattern generator (ALPG) 230 of FIG. 3 to a semiconductor package or a device under test (DUT) 20 of FIG. 3 to be tested, reading a signal output from the semiconductor package or DUT 20, and comparing a read output signal with an expected pattern. When the output signal does not match an expected pattern for an input, the test controller 200 may identify the DUT or the semiconductor package 20, to be defective. For example, when a DUT is a semiconductor memory device such as Dynamic random-access memory (DRAM) or NAND, a test program may record data generated by the algorithmic pattern generator (ALPG) 230 by using a recording operation and read data from the DUT to compare a read pattern with an expected pattern.

The DUT socket 600 may have various shapes according to the shape and type of a DUT (or a semiconductor package) to be tested, that is, the semiconductor package 20. For example, the DUT socket 600 may be a socket having a shape corresponding to ball grid arrays (BGAs), a plastic leaded chip carrier (PLCC), a plastic dual in-line package (PDIP), a ceramic dual in-line package (CERDIP), a plastic metricquad flat pack (MQFP), a thin quad flatpack (TQFP), a small outline (SOIC), a shrink small outline package (SSOP), a thin small outline (TSOP), or a thin quad flatpack (TQFP), or a universal socket corresponding to various shapes. Alternatively, the DUT socket 600 may be a shape of a connector and capable of accommodating a socket having various shapes corresponding to the DUT or the semiconductor package.

The memory unit 300 may store a signal, for example, a test pattern command, received from the wireless signal unit 400, data read from the DUT, and a result of a test performed by the test controller 200. The memory unit 300 may include a buffer 310 and a storage 320. For example, the buffer 310 may be formed of a volatile memory and the storage 320 may be formed of a non-volatile memory. In some example embodiments, the buffer 310 may be formed of DRAM and the storage 320 may be formed of a flash memory, a solid state drive (SSD), or a hard disk drive (HDD).

The buffer 310 may temporarily store the signals received from the wireless signal unit 400, the data read from the DUT, and the result of a test to be transmitted via the wireless signal unit 400. The storage 320 may store the test pattern command or the test result.

Figure 3:
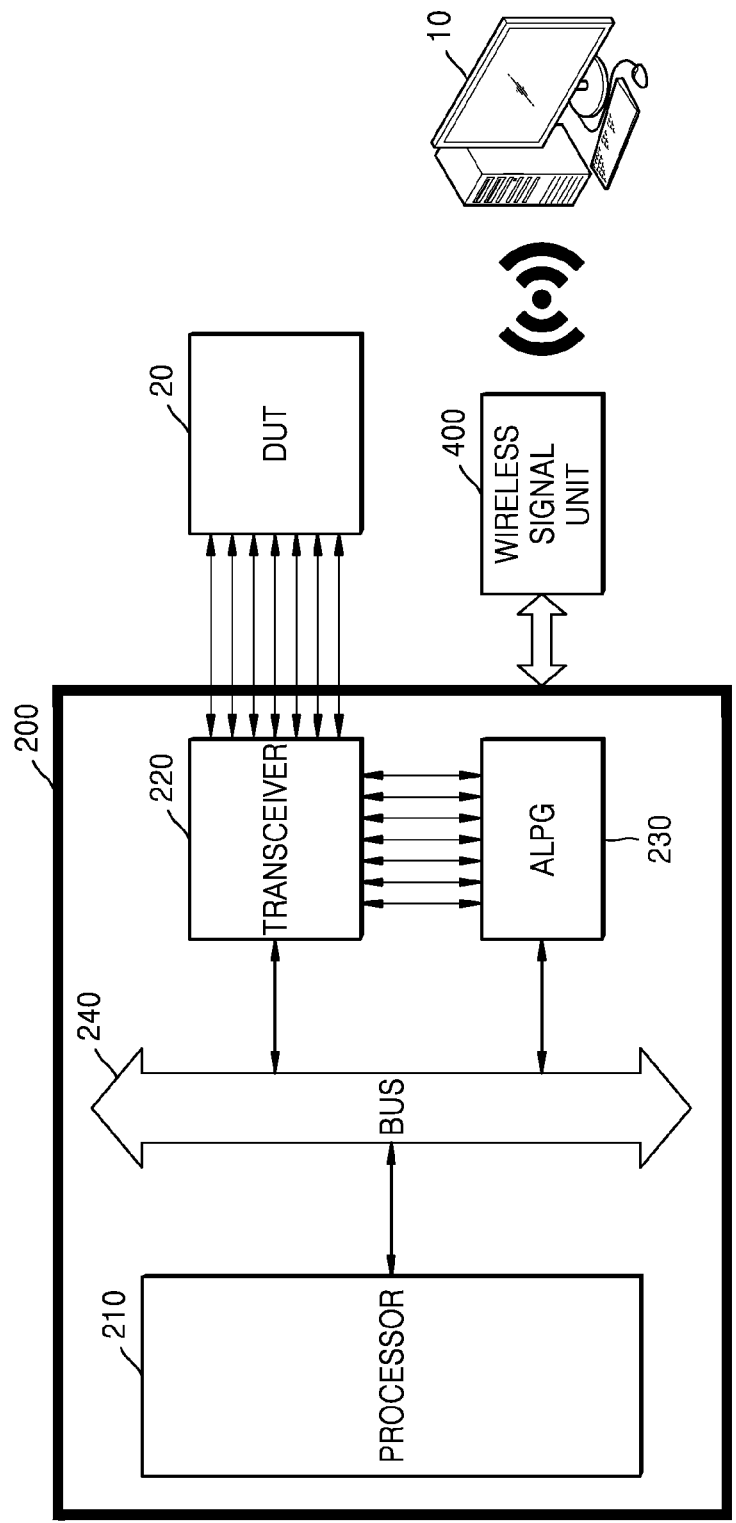
FIG. 3 is a block diagram illustrating an operation of a test controller included in the test board, according to an example embodiment.

The wireless signal unit 400 may exchange signals with an external server 10 of FIG. 3 in a wireless communication method. The wireless signal unit 400 may receive a control signal and/or a test pattern command from the external server 10. Also, the wireless signal unit 400 may transmit a test result to the external server 10.

The wireless signal unit 400 may include a transmission antenna and a receiving antenna, which are separately provided, or a transceiving antenna. The wireless communication between the wireless signal unit 400 and the external server 10 may be performed in a method such as infrared data association (IrDA), radio frequency identification (RFID), Zigbee, Bluetooth, Wi-Fi, or ultra wideband (UWB). Alternatively, the wireless communication between the wireless signal unit 400 and the external server 10 may be performed by combining a method suitable for a low-capacity data transmission, for example, Zigbee, and a method suitable for a high-capacity data transmission, for example, Wi-Fi or UWB, so that the control signal that is low-capacity data and the test result that is high-capacity data may be separately transmitted. Alternatively, the wireless communication between the wireless signal unit 400 and the external server 10 may be performed by combining the above methods and an electrostatic induction or magnetic induction method. In the example embodiment, the wireless communication between the wireless signal unit 400 and the external server 10 may be implemented by a proximity wireless method in which information is transmitted only within a distance of a few centimeters, thereby improving security.

A detailed structure of the wireless signal unit 400 is described later with reference to FIG. 4.

The wireless power unit 500 may be wirelessly charged and may supply electric power to the test controller 200, the memory unit 300, the wireless signal unit 400, and the DUT socket 600 as shown in FIG. 1.

The wireless power unit 500 may receive electric power in a radiative method using radio frequency (RF) waves or ultrasound waves, an inductive coupling method using magnetic induction, or a non-radiative method using magnetic resonance. According to the radiative method, power energy may be wirelessly received by using a monopole or an antenna such as a planar inverted-F antenna (PIFA). For example, in the radiative method, an electric field or a magnetic field that varies according to time affects each other generating radiation, and when there are antennas of the same frequency, electric power may be received according to the polarization characteristics. According to the inductive coupling method, a coil is wound a plurality of turns to generate a strong magnetic field in one direction and a oil resonating within a frequency of a similar range is approached to generate coupling, thereby wirelessly receiving power energy. According to the non-radiative method, power energy may be wirelessly received by using evanescent wave coupling in which electromagnetic waves is moved between two media resonating at the same frequency via a near-field electromagnetic field.

The wireless power unit 500 may include an antenna, a coil, or a resonator to receive electric power. Also, wireless power unit 500 may further include a battery such as a secondary battery to store received electric power. A secondary battery may be, for example, a nickel-cadmium (NiCd) battery, a nickel-metal hydride (NiMH) battery, a lithium-ion (Li-ion) battery, a lithium-ion polymer (Li-ion polymer) battery, etc.

A detailed structure of the wireless power unit 500 is described later with reference to FIG. 4.

The test board 100 may include a board substrate 110. The board substrate 110 may be, for example, a printed circuit board, a ceramic substrate, or an interposer. When the board substrate 110 is a printed circuit board, the board substrate 110 may include a substrate base, and an upper pad and a lower pad respectively formed on an upper surface and a lower surface of the substrate base. The test controller 200, the memory unit 300, the wireless signal unit 400, the wireless power unit 500, and the DUT socket 600 may be electrically connected to one another through the upper pad and/or the lower pad. The substrate base may be formed of at least one material selected from phenol resin, epoxy resin, and polyimide. For example, the substrate base may include at least one material selected from FR4, tetrafunctional epoxy, polyphenylene ether, epoxy/polyphenylene oxide, bismaleimide triazine (BT), thermount, cyanate ester, polyimide, and liquid crystal polymer. The upper pad and the lower pad may be formed of copper, nickel, stainless steel, or beryllium copper. An inner wiring for electrically connecting the upper pad and the lower pad may be formed in the substrate base. The upper pad and the lower pad may be exposed portions of a circuit wiring formed by coating copper foil on the upper and lower surfaces of the substrate base, patterning the circuit wiring, and exposing the patterned circuit wiring by using a solder resist layer.

When the board substrate 110 is an interposer, the board substrate 110 may include a substrate base formed of a semiconductor material, and an upper pad and a lower pad respectively formed on an upper surface and a lower surface of the substrate base. The substrate base may be obtained from, for example, a silicon wafer. Also, a wiring may be formed on the upper and lower surfaces of or in an interior of the substrate base. Also, a through via for electrically connecting the upper pad, the lower pad, and the wirings may be formed in the interior of the substrate base.

The test controller 200 may be attached to a surface 112 (a first surface) of the board substrate 110, that is, the upper surface of the substrate base. The memory unit 300 and the wireless signal unit 400 may be attached to the surface 112 of the board substrate 110. In other words, in example embodiments, the test controller 200, the memory unit 300, and the wireless signal unit 400 may be attached to the same surface of the board substrate 110. However, the example embodiment is not limited thereto.

The wireless power unit 500 may be attached to an opposite surface 114 (a second surface) of the board substrate 110, that is, a surface 114 opposite to the surface 112 of the board substrate 110. In some embodiments, for example, some elements constituting the wireless power unit 500 may be attached to the surface 112 of the board substrate 110 and the other elements constituting the wireless power unit 500 may be attached on the opposite surface 114 of the board substrate 110.

In some embodiments, the antenna of the wireless signal unit 400 and a device for receiving electric power of the wireless power unit 500, for example, an antenna, a coil, or a resonator may be attached to different surfaces of the board substrate 110.

The DUT socket 600 may be connected to the board substrate 110. In some embodiments, the DUT socket 600 may be attached to the surface 112 of the board substrate 110. Alternatively, in some embodiments, the DUT socket 600 may be connected to the board substrate 110 through a connector 650 of FIG. 2 attached to a side surface 113 connecting the surface 112 and the opposite surface 114 of the board substrate 110.

In some embodiments, the test board 100 may further include a case 120 covering the board substrate 110 and some elements included in the test board 100. When the DUT socket 600 is attached to the surface 112 of the board substrate 110, the case 120 may be formed to have the DUT socket 600 exposed. The case 120 may insulate the antenna included in the wireless signal unit 400 and the device for receiving electric power included in the wireless power unit 500 from the outside.

The test board 100 may be connected, by wire, only to the DUT socket 600 that accommodates the semiconductor package 20 that is a DUT, that is, an object to be tested, not to an external server that exchanges signals or a power supply unit that supplies electric power. Accordingly, when a plurality of DUTs are simultaneously tested by using a plurality of the test boards 100, the wired connection between the external server and/or the power supply unit is not needed and a handler for electrically connecting the DUTs to test equipment is not necessary and thus the size of the test equipment may be decreased and a space use efficiency for test may be improved.

Figure 2:
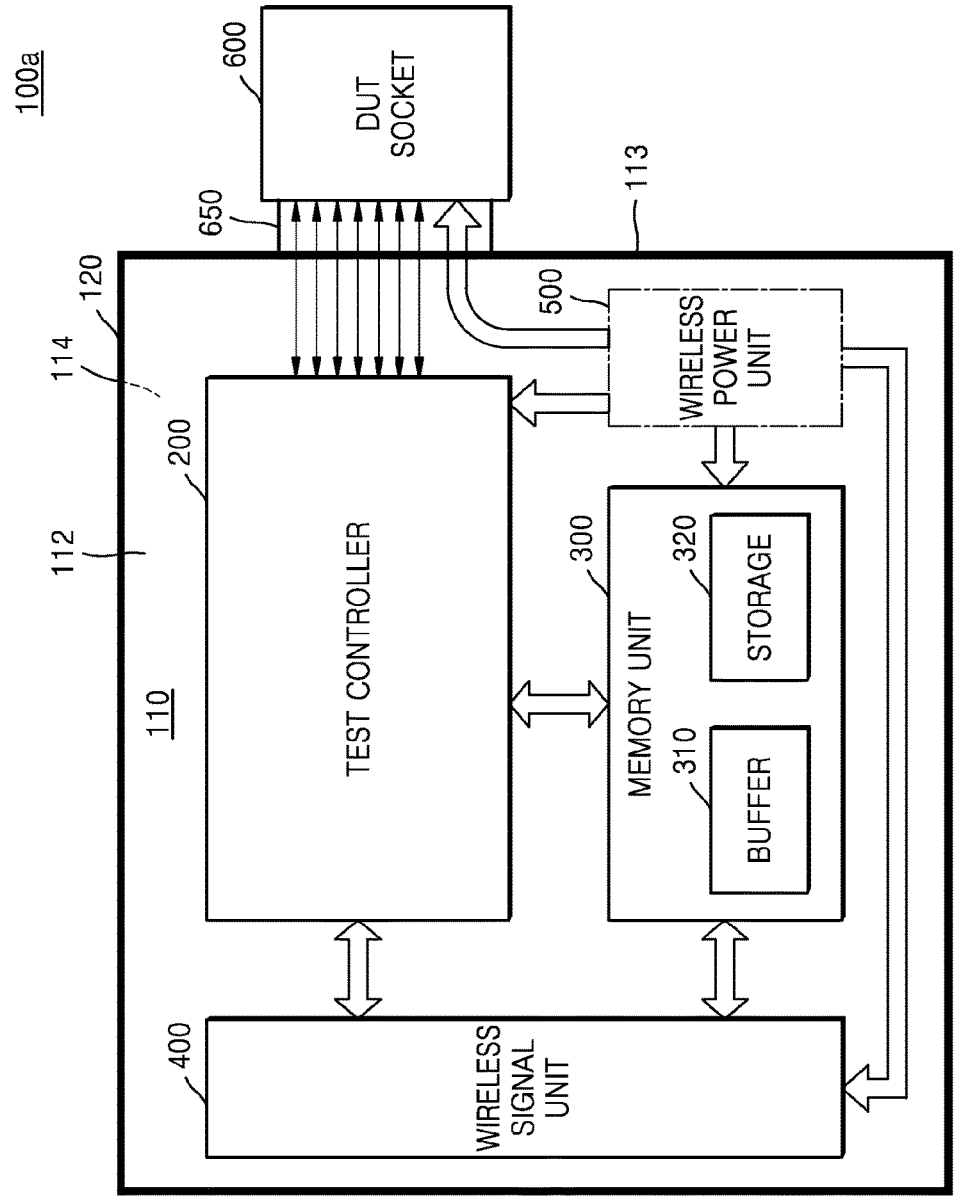
FIG. 2 is a block diagram illustrating a test board according to an example embodiment.

FIG. 2 is a block diagram illustrating a test board 100a according to an example embodiment. Any descriptions in FIG. 2 that are redundant with respect to the descriptions in FIG. 1 may be omitted.

Referring to FIG. 2, the test board 100a to test a semiconductor package may include the test controller 200, the wireless signal unit 400, the wireless power unit 500, and the DUT socket 600. The test board 100a may further include the memory unit 300.

The test controller 200 may communicate with the DUT socket 600 and may independently perform a test on a semiconductor package accommodated in the DUT socket 600.

The test board 100a may include the board substrate 110. The test controller 200 may be attached to the surface 112 of the board substrate 110. The DUT socket 600 may be connected to the board substrate 110. The DUT socket 600 may be attached to one side of the board substrate 110. For example, the DUT socket 600 may be detachably connected to the board substrate 110 by being connected to a connector 650 attached to one side (i.e., a side surface 113) of the board substrate 110.

Accordingly, the DUT socket 600 may be separated/detached from the connector 650. In the example embodiment, that is, in the state in which the DUT socket 600 is separated/detached from the connector 650, the semiconductor package 20 of FIG. 6 that is a DUT, that is, an object to be tested, may be accommodated in the DUT socket 600. In the state in which a DUT is accommodated the DUT socket 600, the DUT socket 600 may be connected to the connector 650 thereby being connected to the test board 100a.

FIG. 3 is a block diagram illustrating an operation of the test controller 200 included in a test board, according to an example embodiment.

Referring to FIG. 3, the test controller 200 may include a processor 210, a transceiver 220, the algorithmic pattern generator (ALPG) 230, and a bus 240. The bus 240 may connect elements of the test controller 200, for example, the processor 210, the transceiver 220, and the algorithmic pattern generator 230.

In some example embodiments, the test controller 200 may be formed as a single semiconductor chip such as FPGA, ASIC, or AP. At least one of the processor 210, the transceiver 220, and the algorithmic pattern generator (ALPG) 230 may be a functional block in the test controller 200. A functional block, which is also referred to as intellectual property (IP), may signify a block unit that is divided as a functional unit/block that may be actually developed. When the test controller 200 is a single semiconductor chip, the test controller 200 may be formed by arranging and assembling functional blocks that are separately designed and then performing a manufacturing process on the functional blocks. Alternatively, at least one of the processor 210, the transceiver 220, and the algorithmic pattern generator (ALPG) 230 may be a portion that is separately programmed and written in the test controller 200 to perform its own function in the test controller 200.

In some example embodiments, the processor 210 may be formed in an acorn RISC machine (ARM) architecture. In some example embodiments, the transceiver 220 may include at least one of a serial transceiver and a parallel transceiver. In some example embodiments, the transceiver 220 may be formed of a GTP transceiver, a GTX transceiver, a GTH transceiver, or a GTX transceiver.

The algorithmic pattern generator (ALPG) 230 may be programmed to generate data on the fly. In some example embodiments, the algorithmic pattern generator (ALPG) 230 may generate an incremental pattern, a pseudorandom pattern, or a pattern of a certain type. In some example embodiments, the algorithmic pattern generator (ALPG) 230 may generate a test pattern including a stripe pattern, an inclined stripe pattern, or an intersecting pattern. In some example embodiments, the algorithmic pattern generator 230 may use a finite state machine or a counter or linear feedback resister to generate a test pattern. In some example embodiments, the algorithmic pattern generator 230 may receive a default value to generate a further compound pattern.

When the wireless signal unit 400 receives a signal that is wirelessly transmitted by the external server 10, the received signal may be stored in the memory unit 300 of FIG. 1 and then transmitted to the test controller 200 or may be transmitted directly to the test controller 200. The external server 10 may wirelessly transmit a control signal and/or a test pattern command to the wireless signal unit 400. The processor 210, in response to the control signal, controls the algorithmic pattern generator (ALPG) 230 to generate a test pattern in response to the test pattern command, and controls the transceiver 220 to input the test pattern generated by the algorithmic pattern generator (ALPG) 230 to a DUT 20, that is, the semiconductor package 20.

Then, the transceiver 220 may receive the signal output from the semiconductor package 20 based on the test pattern. The processor 210 may perform a functional test to compare the output signal that the transceiver 220 received with an expected pattern. Accordingly, whether the semiconductor package 20 is defective may be identified based on the comparison. Whether the semiconductor package 20 is defective and/or the output signal of the semiconductor package 20 may be wirelessly transmitted by the wireless signal unit 400 to be received by the external server 10.

At least one of the test pattern generated by the algorithmic pattern generator (ALPG) 230, the expected pattern, the output signal of the semiconductor package 20, and information on whether the semiconductor package 20 is defective may be stored in the memory unit 300 in the process of testing the semiconductor package 20 and transmitting a test result to the external server 10.

In some example embodiments, at least one of the signal received from the external server 10, the test pattern generated by the algorithmic pattern generator 230, the expected pattern, the output signal of the semiconductor package 20, and whether the semiconductor package 20 is defective may be stored in the memory unit 300 even after the test of the semiconductor package 20 is completed. The above information stored in the memory unit 300 may be used for a test of another semiconductor package or for a re-test of the semiconductor package 20 that has been already tested.

Figure 4:
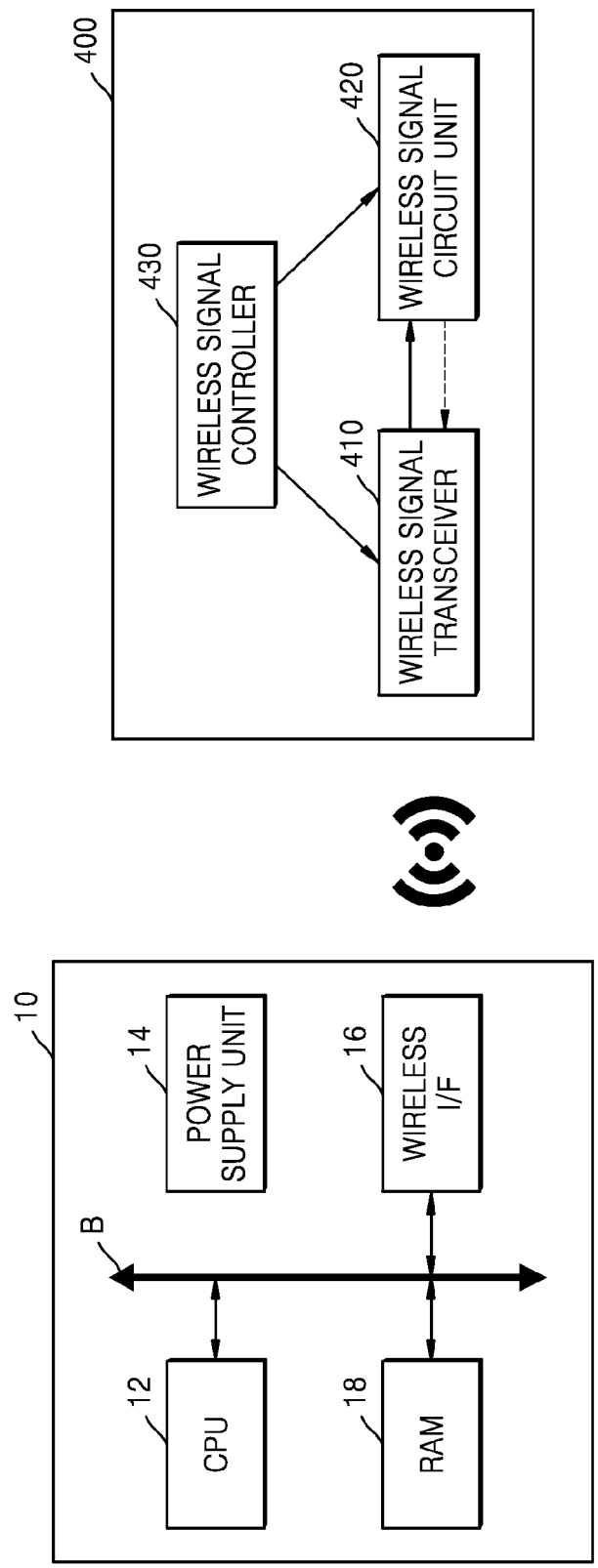
FIG. 4 is a block diagram illustrating an operation of a wireless signal unit included in the test board, according to an example embodiment.

FIG. 4 is a block diagram illustrating an operation of the wireless signal unit 400 included in a test board, according to an example embodiment.

Referring to FIG. 4, an external server 10 may be, for example, a computer system. However, the external server 10 may correspond to all electronic apparatuses capable of transceiving data with an external apparatus, for example, portable computers, personal digital assistants (PDAs), mobile phones, repeaters, access point (AP), and portable electronic apparatuses. When the external server 10 is a computer system, a control signal and data are transferred among a central processing unit (CPU) 12, random-access memory RAM 18, and a wireless interface (I/F) 16 in the external server 10 via an internal bus B. In some example embodiments, the wireless I/F 16 may include a SATA I/F, a wired standard IF apparatus supporting ATA, SATA1, SATA2, and SAS protocols, and a wireless I/F apparatus connected thereto. Because the structure of the external server 10 in FIG. 4 is a mere example of using a general computer system, the present disclosure is not limited thereto and, as described above, any electronic apparatus capable of wirelessly transceiving data with an external apparatus may be employed as the external server 10.

A power supply unit 14 may be a part of the external server 10 or a separate external power supply apparatus from the external server 10.

The wireless signal unit 400 may include a wireless signal transceiver 410, a wireless signal circuit unit 420, and a wireless signal controller 430. The test board 100 of FIG. 1 or 100a of FIG. 2 may wirelessly transceive signals with the external server 10. To this end, signals may be wirelessly transceived via the wireless signal transceiver 410 and the wireless I/F 16.

The wireless signal transceiver 410 may include a transmission antenna and a receiving antenna, which are separately provided, or a transceiving antenna. Also, the wireless I/F 16 may include a transmission antenna and a receiving antenna, which are separately provided, or a transceiving antenna. Also, the wireless I/F 16 may be a separate apparatus provided on the external server 10 or implemented by separately connecting an apparatus having a wireless transceiving function to an existing host having no wireless signal transceiving function. Alternatively, the wireless I/F 16 may be an apparatus integrally formed with the external server 10, or may be implemented by including the wireless signal transceiving function in the external server 10.

A process in which the test board 100 of FIG. 1 or 100a of FIG. 2 receives signals from the external server 10 is described in detail. The wireless I/F 16 of the external server 10 wirelessly transmits signals to the wireless signal transceiver 410. The signal received by wireless signal transceiver 410 is transmitted to the wireless signal circuit unit 420 under the control of the wireless signal controller 430. The wireless signal circuit unit 420 may convert the received signal to a signal in a form of being usable in the test board 100 of FIG. 1 or 100a of FIG. 2. Also, the wireless signal circuit unit 420 may include a filter (not shown) for filtering a wireless signal of an actually usable frequency range among signals wirelessly received from the wireless I/F 16. The wireless signal circuit unit 420 may have information about a predefined frequency range and a protocol with respect to the signal exchangeable between the external server 10 and the test board 100 of FIG. 1 or 100a of FIG. 2, or may receive such information from the wireless signal controller 430. Part of the signal converted by the wireless signal circuit unit 420 may be stored in the memory 300 of FIG. 1 or FIG. 2.

A process in which the test board 100 of FIG. 1 or 100a of FIG. 2 transmits signals to the external server 10 is described in detail. A signal to be transmitted of the signal stored in the memory unit 300 by the wireless signal controller 430 and/or the signal generated by the test controller 200 of FIG. 1 or FIG. 2 may be transmitted to the wireless signal circuit unit 420. The wireless signal circuit unit 420 may convert the data transmitted from the memory unit 300 or the test controller 200 of FIG. 1 or FIG. 2 to a signal suitable for wireless transmission, under the control of by the wireless signal controller 430. The wireless signal circuit unit 420 may include, for example, an impulse generator. The data converted by the wireless signal circuit unit 420 to be suitable for wireless transmission may be transferred to the wireless signal transceiver 410 and wirelessly transmitted. Then, the wirelessly transmitted signal may be received by the wireless I/F 16 and transmitted to the external server 10.

The wireless signal transmission between the wireless signal unit 400 and the wireless I/F 16 may be performed by IrDA, RFID, Zigbee, Bluetooth, Wi-Fi, or UWB, but the present disclosure is not limited thereto. For example, the wireless signal transmission between the wireless signal unit 400 and the wireless I/F 16 may be performed according to other wireless communication protocol, an independent communication protocol, or a newly developed wireless communication protocol.

The wireless signal transceiver 410 may be formed of, for example, a transmission antenna and a receiving antenna. When, for example, the wireless signal transceiver 410 is form of an antenna, the transmission antenna and the receiving antenna may be designed considering the wavelength of an RF used for signal transmission. Alternatively, the wireless signal transceiver 410 may be formed of a coil for signal transceiving. When, for example, the wireless signal transceiver 410 is formed of a coil, transmission and receiving may be performed together by the same coil, or a transmission coil and a receiving coil are provided to separately perform transmission and receiving.

Figure 5:
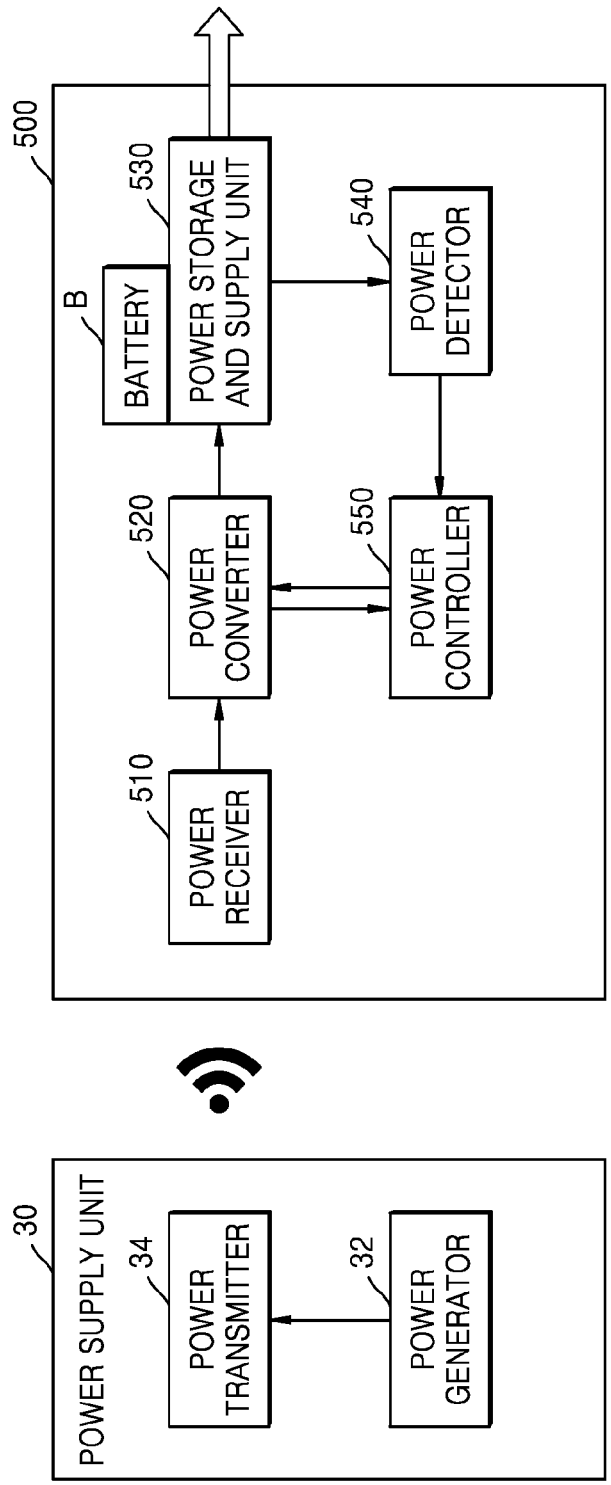
FIG. 5 is a block diagram illustrating an operation of a wireless power unit included in the test board, according to an example embodiment.

FIG. 5 is a block diagram illustrating an operation of the wireless power unit 500 included in a test board, according to an example embodiment.

Referring to FIG. 5, the wireless power unit 500 may wirelessly receive electric power needed for the test board 100 of FIG. 1 or 100a of FIG. 2. The wireless power unit 500 may receive electric power in a radiative method using RF waves or ultrasound waves, an inductive coupling method using magnetic induction, or a non-radiative method using magnetic resonance. The wireless power unit 500 may wirelessly receive electric power from a power supply unit 30.

The power supply unit 30 may include a power generator 32 and a power transmitter 34. The power generator 32 may convert alternating current (AC) or direct current (DC) to a power signal to be transmittable to generate electric power. The power generator 32 may generate current by itself, or may convert electric power supplied from an external power supply source to a power signal. The power transmitter 32 may provide the power signal to the outside. The power signal provided to the outside may be an AC signal. the power transmitter 32 may include an antenna, a coil, or a resonator.

The wireless power unit 500 may include a power receiver 510, a power converter 520, a power storage and supply unit 530, a power detector 540, and a power controller 550.

The power receiver 510 receives electric power from the outside, for example, the power supply unit 30, and transmits the received electric power to the power converter 520. The power receiver 510 may include an antenna, a coil, or a resonator, and the power signal supplied from the outside may be an AC signal. In this case, the power signal may be received by the above-described radiative method, inductive coupling method, or non-radiative method. When necessary, the power receiver 510 may be configured to convert the external power signal into a high frequency AC.

The power converter 520 may convert the power signal, for example, an AC signal, received from the power receiver 510 to a DC signal. In detail, the power converter 520 may include a voltage limiter circuit (not shown) and a rectifier circuit (not shown). The voltage limiter circuit may prevent excessive supply of the AC signal. The rectifier circuit may rectify the AC signal to a DC. When the DC signal is received from the power receiver 510, the power converter 520 may be omitted or may function to convert the DC signal to a certain voltage. Next, the DC signal converted by the power converter 520 may be transferred to the power storage and supply unit 530.

The power storage and supply unit 530 may include a power storage device, such as a capacitor, to store the DC signal received from the power converter 520. Also, the power storage and supply unit 530 may include a secondary battery B. In other words, the power storage and supply unit 530 may temporarily store electric power during the operation of the test board 100 of FIG. 1 or 100a of FIG. 2, may store electric power for an extended period, or may perform both functions. The power storage and supply unit 530, under the control of the power controller 550 that is described later, may supply electric power overall to the test board 100 of FIG. 1 or 100a of FIG. 2.

The power detector 540 continuously measures a power value, for example, a voltage value and a current value, which is supplied from the power converter 520 to the power storage and supply unit 530, and transfers information about the voltage value and the current value to the power controller 550. For example, the power detector 540 may be a circuit including a resistance device capable of directly measuring the voltage value and the current value.

The power controller 550 may control an overall operation of the wireless power unit 500. The power controller 550 may control the operation of the power storage and supply unit 530 by receiving the voltage value and the current value received from the power detector 540. For example, the power controller 550 may compare the voltage value and the current value that are measured and transmitted by the power detector 540 with a certain reference voltage value and a certain reference current value, thereby preventing generation of overvoltage or over-current in the power storage and supply unit 530.

Figure 6:
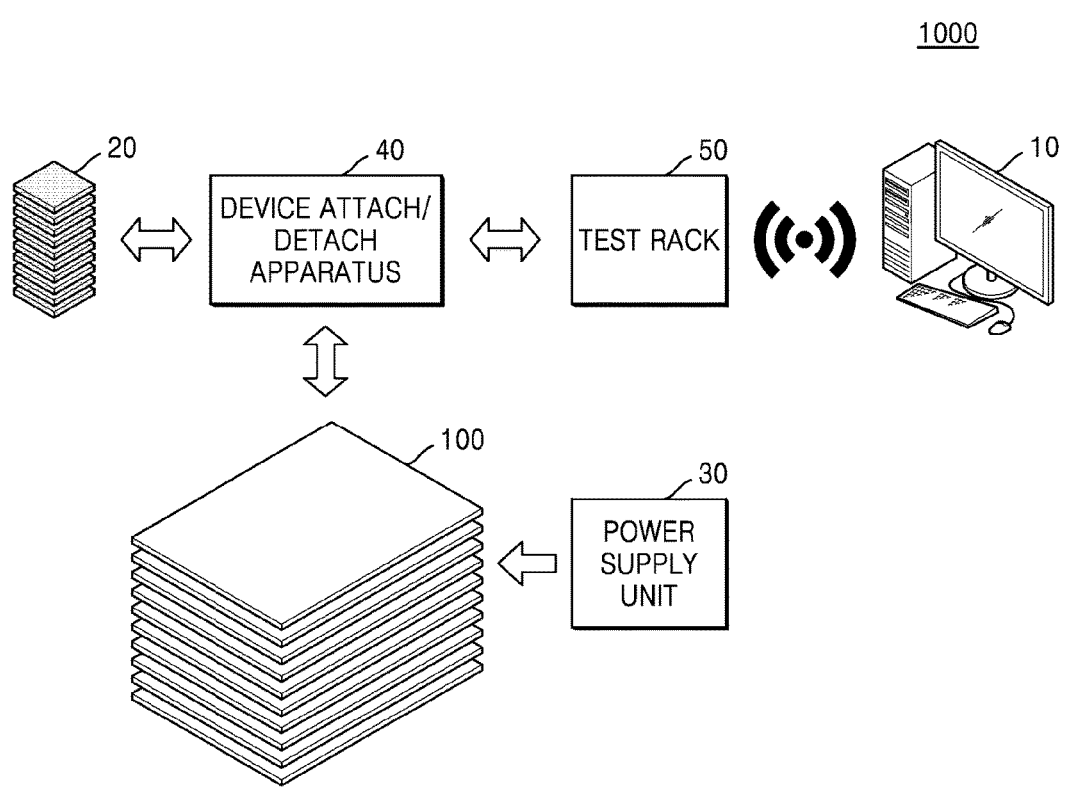
FIG. 6 is a block diagram illustrating a structure and operation of a test system according to an example embodiment.

FIG. 6 is a block diagram illustrating a structure and operation of a test system 1000 according to an example embodiment.

Referring to FIG. 6, the test system 1000 may include the external server 10 and a plurality of test boards 100. In some example embodiments, the plurality of test boards 100 may be placed on a test rack 50. Each of the plurality of test boards 100 may wirelessly receive electric power from the power supply unit 30. Each of the test boards 100 may wirelessly receive electric power form the power supply unit 30 and charge the power storage and supply unit 530 of FIG. 5.

Then, a device attachment/detachment apparatus 40 may connect each of a plurality of DUTs 20, that is, a plurality of semiconductor packages 20, to each of the plurality of test boards 100. Each of the plurality of semiconductor packages 20 may be connected to each of the plurality of test boards 100. The semiconductor package 20 may be connected to the test board 100 by being accommodated in the DUT socket 600 of FIG. 1. In other words, the test boards 100 may charge the power storage and supply unit 530 before the DUT socket 600 accommodates the semiconductor package 20.

Each of the plurality of test boards 100, to which the semiconductor package 20 is connected, is arranged on the test rack 50 and wirelessly exchanges signals with the external server 10 so that the test boards 100 simultaneously and independently perform tests on the semiconductor packages 20.

The test on the semiconductor package 20 may include, for example, a DC test, an AC test, or a functional test. In the DC test, after a voltage or current is input by an analog signal that does not vary, a current to the voltage application or a voltage to the current application may be measured. In the AC test, for example, after a voltage is mainly input by a varying analog signal, a time point when a measured signal changes with respect to a reference signal may be measured. In the functional test, after a varying digital signal is input, for example, a logical error may be determined.

In some example embodiments, a test on the semiconductor package 20 may be performed on the conditions of a room temperature, a lower temperature, or a high temperature. The test on the semiconductor package 20 may be performed on the conditions of a dry condition or a humid condition. In some example embodiments, the test rack 50 may provide a variety of temperature and/or humidity environments.

In some example embodiments, when the plurality of test boards 100 are arranged taking a minimum space and the semiconductor package 20 accommodated in the DUT socket 600 is prevented from being damaged, the test rack 50 may not be used. For example, when the plurality of test boards 100 may be stably stacked due to the case 120 of the test board 100 or the semiconductor package 20 accommodated in the DUT socket 600 does not contact other test boards 100, the test rack 50 may not be used. When the test rack 50 is not in use, the test system 1000 may perform a test in a space in which a temperature and/or humidity environment may be changed.

When the test is completed, the device attachment/detachment apparatus 40 may separate the semiconductor package 20 from the test board 100. In some example embodiments, the device attachment/detachment apparatus 40 may separate the semiconductor package 20 from the test board 100 according to whether the semiconductor package 20 passed or failed the test. In some example embodiments, the device attachment/detachment apparatus 40 may separate the semiconductor package 20 from the test board 100 by dividing the semiconductor package 20 that failed the test into the semiconductor package 20 that is repairable, the semiconductor package 20 to be re-tested, and the semiconductor package 20 to be disposed of.

In some example embodiments, a re-test may be performed on the semiconductor package 20 to be re-tested without being separated from the test board 100. Alternatively, in some example embodiments, after the semiconductor package 20 to be re-tested is separated from the test board 100 where a test has been performed, the semiconductor package 20 to be re-tested is connected to other test board 100 and then a re-test is performed.

Although not illustrated in the drawings, the test board 100 may be substituted with the test board 100a of FIG. 2.

Figure 7:
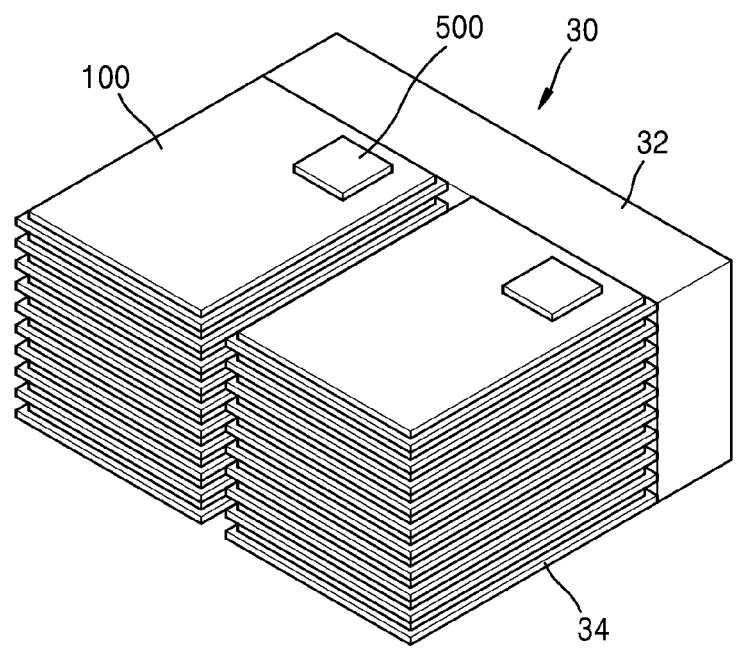
FIG. 7 is a perspective view illustrating operations of a test board and a power supply unit included in the test system, according to an example embodiment.

FIG. 7 is a perspective view illustrating operations of the test board 100 and the power supply unit 30 included in the test system 1000 of FIG. 6, according to an example embodiment.

Referring to FIG. 7, the power supply unit 30 may include the power generator 32 and the power transmitter 34. In some example embodiments, the power supply unit 30 may wirelessly supply electric power in a non-contact energy transmission technology, for example, an inductive coupling method using magnetic induction. In the example embodiment, the power supply unit 30 may include the power transmitters 34. The power transmitters 34 may have a certain interval therebetween and may be connected to the power generator 32. That is, as shown in FIG. 7, the power transmitters 34 may be stacked with an interval therebetween. The interval between the power transmitters 34 may be greater than the thickness of the test board 100. The test board 100 may be arranged on each of the power transmitters 34 of the power supply unit 30. The wireless power unit 500 of the test board 100 that wirelessly received the electric power from each of the power transmitters 34 may store the received electric power and may be charged.

In some example embodiments, the power supply unit 30 may supply electric power in a radiative method using RF waves or ultrasound waves. In the example embodiment, the power supply unit 30 may include only one power transmitter 34. However, the example embodiment is not limited thereto. The test boards 100 may be arranged within several meters from the power transmitter 34 of the power supply unit 30 and wirelessly receive electric power from the power transmitter 34.

Alternatively, electric power may be supplied through a non-radiative method using magnetic resonance. In this case, the power supply unit 30 may include the power transmitters 34 having other resonance frequency. Each of the test boards 100 may include the power receiver 510 of FIG. 5 corresponding to other resonance frequency of the power transmitters 34.

Figure 8:
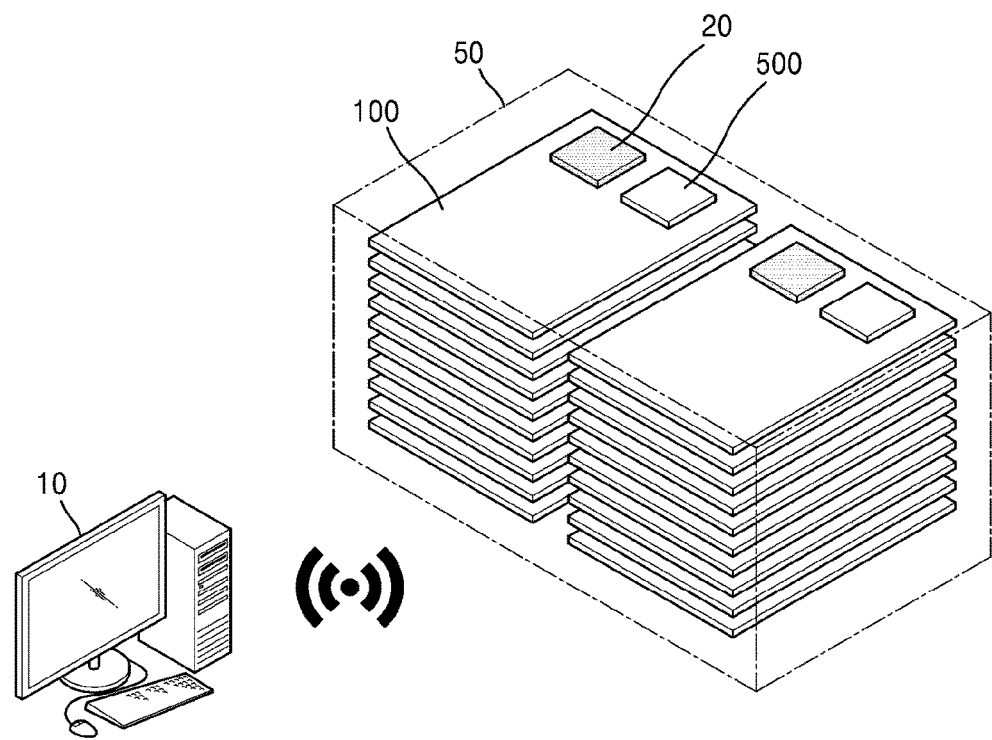
FIG. 8 is a view illustrating a test method of a test system according to an example embodiment.

FIG. 8 is a view illustrating a test method of a test system according to an example embodiment.

Referring to FIG. 8, the test boards 100, to which the semiconductor packages 20 are connected, may wirelessly exchange signals with the external server 10 and perform a test on each of the semiconductor packages 20. In some example embodiments, the test boards 100 may be arranged on the test rack 50.

Each of the test boards 100 may have different identity code from one another. For example, the identity code may be a media access control (MAC) address. Accordingly, the test boards 100 may wirelessly receive signals simultaneously or sequentially from the external server 10 and perform a test. Also, because the wireless power unit 500 is already charged, each of the test boards 100 may perform a test even when there is no separate connection line for power supply.

Figure 9:
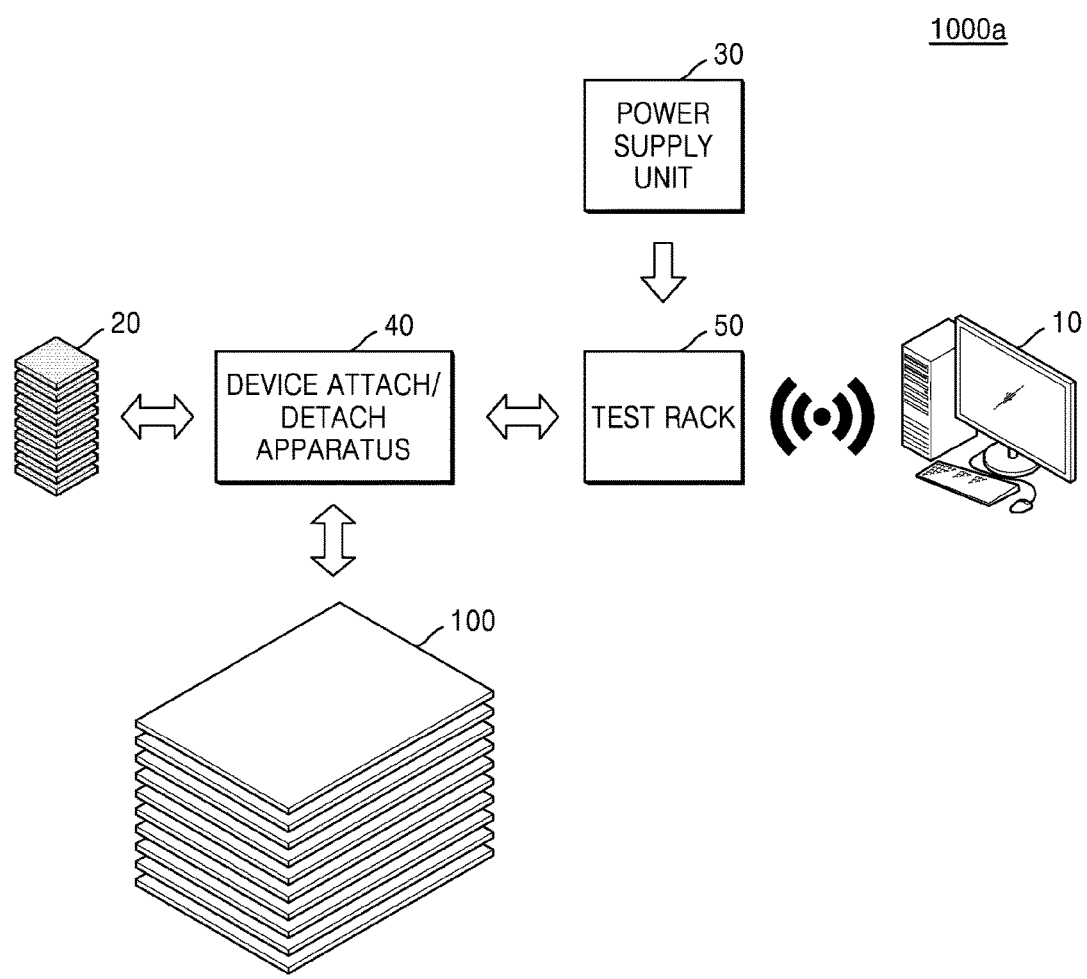
FIG. 9 is a block diagram illustrating a structure and operation of a test system according to an example embodiment.

FIG. 9 is a block diagram illustrating a structure and operation of a test system 1000a according to an example embodiment. Any descriptions in FIG. 9 that are redundant to the descriptions in FIG. 6 may be omitted.

Referring to FIG. 9, the test system 1000a may include an external server 10 and a plurality of test boards 100. A device attachment/detachment apparatus 40 may connect a plurality of DUTs 20, that is, a plurality of semiconductor packages 20, to the plurality of test boards 100. Each of the semiconductor packages 20 may be connected to each of the plurality of test boards 100.

Then, the plurality of test boards 100, to which the plurality of semiconductor packages 20 are respectively connected, may wirelessly receive electric power from the power supply unit 30, wirelessly exchange signals with the external server 10, and perform a test on each of the semiconductor packages 20.

In other words, while performing a test on each of the test boards 100 with the semiconductor package 20 accommodated in the DUT socket 600, the test board 100 may charge the power storage and supply unit 530 of FIG. 5. In some example embodiments, in the test boards 100, at least part of the power storage and supply unit 530 may be charged by the plurality of test boards 100 before the semiconductor package 20 is accommodated in the DUT socket 600. In some example embodiments, the secondary battery B may be charged in the middle of performing the test.

In some example embodiments, the plurality of test boards 100 may be arranged on the test rack 50.

After the test is completed, the device attachment/detachment apparatus 40 may separate the semiconductor package 20 from the test board 100.

Although not illustrated in the drawings, the test board 100 may be substituted with the test board 100a of FIG. 2.

Figure 10:
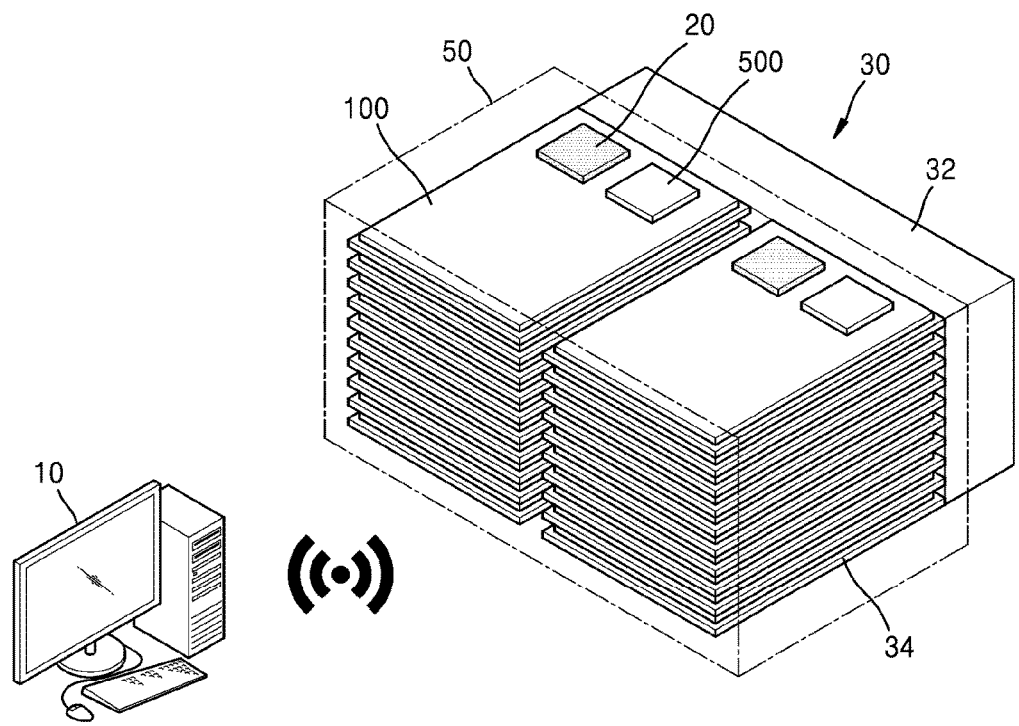
FIG. 10 is a view illustrating a test method of a test system according to an example embodiment.

FIG. 10 is a view illustrating a test method of the test system 1000a according to an example embodiment. Any descriptions in FIG. 10 that are redundant to the descriptions in FIGS. 7 and 8 may be omitted.

Referring to FIG. 10, the test board 100 to which the semiconductor package 20 is connected may wirelessly receive electric power from the power supply unit 30, wirelessly exchange signals with the external server 10, and perform a test on each semiconductor package 20.

In some example embodiments, the power supply unit 30 and the test rack 50 may be integrally formed.

Also, because the wireless power unit 500 wirelessly supplies electric power to each of the plurality of test boards 100 during the test of the test board 100, each of the test boards 100 may stably perform a test without a connection line for power supply.

Figure 11:
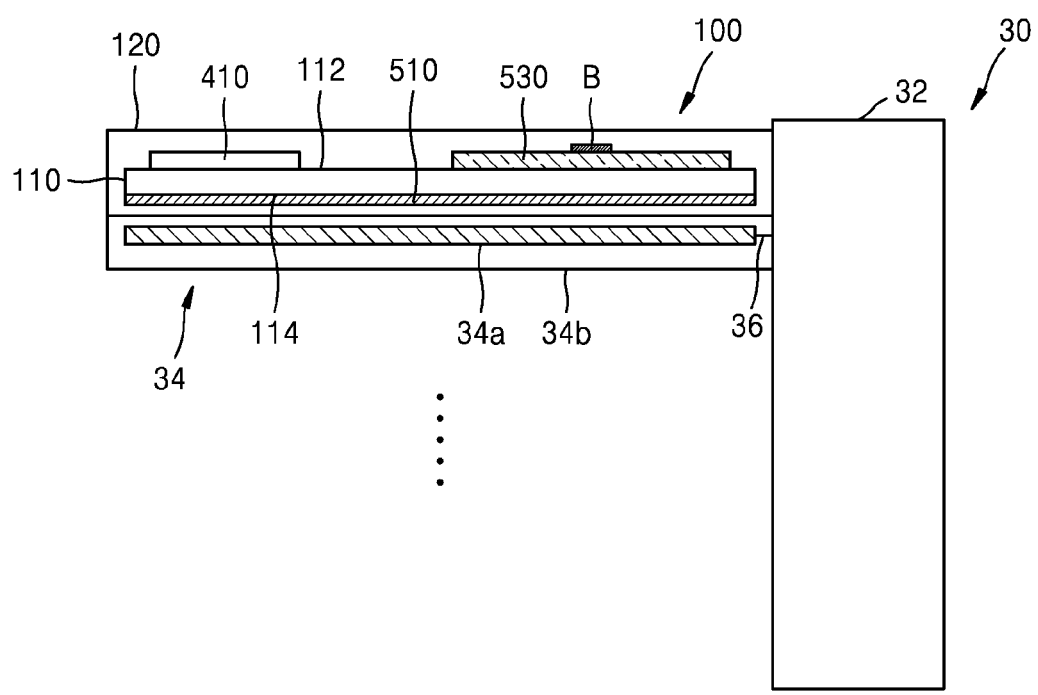
FIG. 11 a cross-sectional view schematically illustrating structures of a power supply unit and a test board included in the test system, according to an example embodiment.

FIG. 11 a cross-sectional view schematically illustrating structures of a power supply unit 30 and a test board 100 included in a test system, according to an example embodiment.

Referring to FIG. 11, the power supply unit 30 may include a power generator 32 and a power transmitter 34. The power transmitter 34 may include a power signal generator 34a and a cover unit 34b encompassing the power signal generator 34a. The power signal generator 34a may be electrically connected to the power generator 32 via a power wiring 36.

The test board 100 may be arranged on the power transmitter 34. The test board 100 may include the board substrate 110, the case 120, the wireless signal transceiver 410, the power receiver 510, and the power storage and supply unit 530. Although not illustrated in the drawings, the test board 100 may further include other elements of the test board 100 described in FIG. 1 and FIGS. 3 to 5. Also, the test board 100 may be substituted with the test board 100a of FIG. 2.

The wireless signal transceiver 410 is arranged on the surface 112 (the first surface) of the board substrate 110. The power receiver 510 may be arranged on an opposite surface 114 (the second surface) of the board substrate 110. In some example embodiments, the power receiver 510 may wirelessly receive electric power in a non-contact method while the power receiver 510 is spaced apart from the power signal generator 34a at an interval within about 1 cm or an interval of about 1 cm or less.

The power storage and supply unit 530 may be arranged on the first surface 112 of the board substrate 110. Alternatively, in some example embodiments, a battery B such as a secondary battery included in the power storage and supply unit 530 may be arranged on the first surface 112 of the board substrate 110.

The wireless signal transceiver 410 and the power receiver 510 may be arranged on the opposite surfaces of the board substrate 110 from each other, thereby reducing interference therebetween. The power receiver 510 may use a maximum area of the opposite surface 114 of the board substrate 110 so that a power receiving efficiency may be improved.

Figure 12:
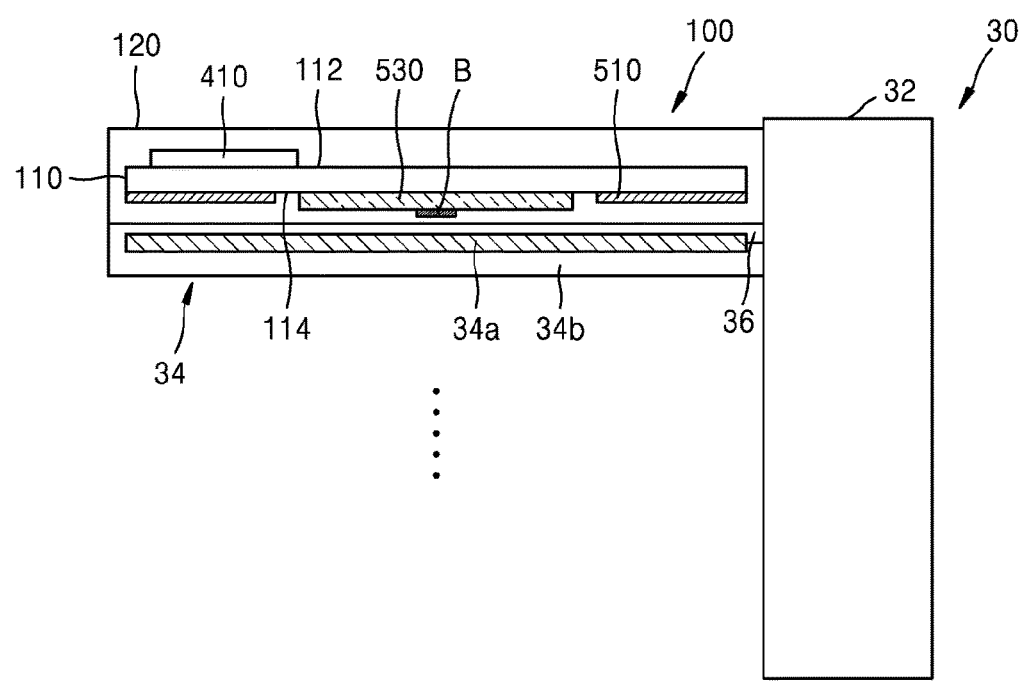
FIG. 12 a cross-sectional view schematically illustrating structures of the power supply unit and the test board included in the test system, according to an example embodiment.

FIG. 12 a cross-sectional view schematically illustrating structures of a power supply unit 30 and a test board 100 included in a test system, according to an example embodiment. Any descriptions in FIG. 12 that are redundant to the descriptions in FIG. 11 may be omitted.

Referring to FIG. 12, the power supply unit 30 may include a power generator 32 and a power transmitter 34. The power transmitter 34 may include the power signal generator 34a and the cover unit 34b encompassing the power signal generator 34a. The power signal generator 34a may be electrically connected to the power generator 32 via the power wiring 36.

The test board 100 may be arranged on the power transmitter 34. The test board 100 may include the board substrate 110, the case 120, the wireless signal transceiver 410, the power receiver 510, and the power storage and supply unit 530.

The wireless signal transceiver 410 is arranged on the first surface 112 of the board substrate 110. The power receiver 510 may be arranged on the opposite surface 114 of the board substrate 110. The power storage and supply unit 530 may be arranged on the opposite surface 114 of the board substrate 110. Alternatively, in some example embodiments, a battery B such as a secondary battery included in the power storage and supply unit 530 may be arranged on the opposite surface 114 of the board substrate 110.

The power receiver 510 may be arranged along an edge of the opposite surface 114 of the board substrate 110, encompassing the power storage and supply unit 530 as shown in FIG. 12.

The wireless signal transceiver 410 and the power receiver 510 may be arranged on the opposite surfaces of the board substrate 110, thereby reducing interference therebetween. The power receiver 510 and the power storage and supply unit 530 may be arranged together on the opposite surface 114 of the board substrate 110 so that the power storage and supply unit 530 may be charged by reducing loss of the power signal received by the power receiver 510. Accordingly, a power receiving efficiency may be improved.

Figure 13:
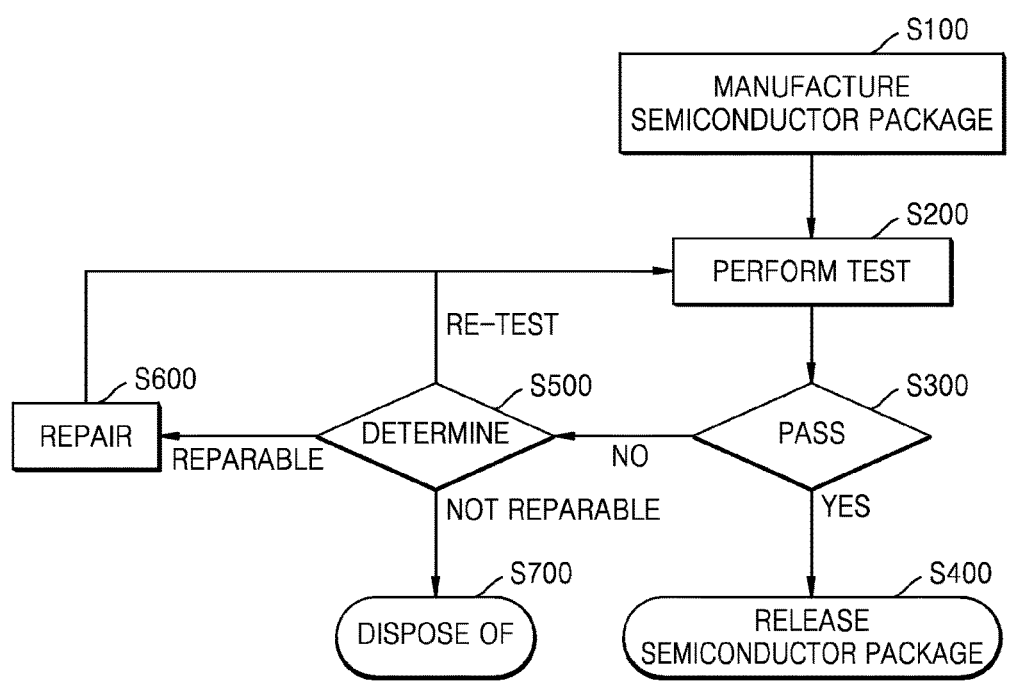
FIG. 13 is a flowchart for explaining a method of manufacturing a semiconductor device according to an example embodiment.

FIG. 13 is a flowchart for explaining a method of manufacturing a semiconductor device according to an example embodiment.

Referring to FIG. 13 with FIGS. 1 to 12 altogether, the semiconductor package 20 is manufactured (S100).

In the process of manufacturing the semiconductor package 20, in detail, a semiconductor substrate is prepared and thus a semiconductor device is manufactured. The semiconductor device may include, for example, system large scale integration (LSI), flash memory, DRAM, SRAM, EEPROM, PRAM, MRAM, or RRAM.

The semiconductor substrate may include, for example, silicon (Si). Alternatively, the semiconductor substrate may include a semiconductor element such as germanium (Ge), or a compound semiconductor such as silicon carbide (SiC), gallium arsenide (GaAs), indium arsenide (InAs), and indium phosphide (InP). Also, the semiconductor substrate may have a silicon on insulator (SOI) structure. For example, the semiconductor substrate may include a buried oxide (BOX) layer.

Next, a device isolation structure to define conductive regions and active regions is formed in the semiconductor substrate. The conductive regions may include, for example, a well doped with impurities. The device isolation structure may include various device isolation structures, for example, a shallow trench isolation (STI) structure or a deep trench isolation (DTI) structure.

Next, a semiconductor device including various types of a plurality of individual devices is formed on the semiconductor substrate including the active regions defined by the device isolation structure. The individual devices may include various microelectronic devices, for example, a metal-oxide-semiconductor field effect transistor (MOSFET) such as a complementary metal-insulator-semiconductor transistor (CMOS transistor), a system large scale integration (LSI), an image sensor such as a CMOS imaging sensor (CIS), a micro-electro-mechanical system (MEMS), an active device, and a passive device.

The individual devices may be electrically connected to the conductive region. The semiconductor device may further include at least two of the individual devices or a conductive wiring or a conductive plug electrically connecting the individual devices and the conductive region. Also, the individual devices may be electrically isolated from other neighboring individual devices by an insulating film. The semiconductor device may include various circuit elements to drive the individual devices. Also, the semiconductor device may include a metal wiring or a metal via for electrically connecting between the individual devices and/or circuit elements, and an inter-metal insulating film.

After a plurality of semiconductor devices are formed on the semiconductor substrate, individual semiconductor devices are separated and packaged, thereby forming the semiconductor package 20. The semiconductor package 20 may have a connection terminal to be connected to the DUT socket 600.

In some example embodiments, the semiconductor package 20 may include a plurality of semiconductor device (i.e., a plurality of semiconductor chip dies). In some example embodiments, the semiconductor package 20 may include a plurality of homogeneous semiconductor chip dies. In some example embodiments, the semiconductor package 20 may include a plurality of heterogeneous semiconductor chip dies.

In some example embodiments, the semiconductor package 20 may be a package on package (PoP), chip scale packages (CSPs), a die in waffle pack, a die in wafer form, a chip on board (COB), a system in package (SIP), a multi chip package (MCP), a wafer-level fabricated package (WFP), or a wafer-level processed stack package (WSP).

Next, a test is performed on the semiconductor package 20 that is manufactured (S200). The test on the semiconductor package 20 may include, for example, a DC test, an AC test, or a functional test. To perform a test on the semiconductor package 20, the semiconductor package 20 is connected to the test socket (e.g., a DUT socket) 600 of the test board 100 or 100*a*. Next, the test board 100 or 100*a* may wirelessly receive a control signal and/or a test pattern command from the external server 10 and independently perform a test on the semiconductor package 20. In the example embodiment, after the plurality of semiconductor packages 20 are connected to the plurality of test boards 100 or 100*a*, each of the test boards 100 or 100*a* may independently and simultaneously perform a test on each of the semiconductor packages 20. Next, a result of the test on each of the semiconductor packages 20 connected to the test boards 100 or 100*a* may be wirelessly transmitted to the external server 10.

Each of the plurality of test boards 100 or 100*a* may receive the electric power that is wirelessly received and stored in the wireless power unit 500 and perform a test on each of the semiconductor packages 20 (i.e. the DUT). In some example embodiments, each of the test boards 100 or 100*a* may wirelessly receive electric power before the semiconductor package 20 is connected to the test board 100 or 100*a* (i.e., before the test is performed), and previously charge the power storage and supply unit 530 of the wireless power unit 500. In some example embodiments, each of the test boards 100 or 100*a* may wirelessly receive electric power and perform a test while a test is performed as the semiconductor package 20 is connected to the test board 100 or 100*a*.

Whether a test result is passed or not is checked (S300), and the semiconductor package 20 passed the test (Y) may be supplied to markets (S400). In contrast, in the checking of whether to pass the test (S300), the semiconductor package 20 that failed to pass the test (N) is moved to a determination process (S500).

The semiconductor package 20 that passed the test is separated from the test board 100 or 100*a* and may be supplied to markets. In some example embodiments, the device attachment/detachment apparatus 40 may be used to connect or separate the semiconductor package 20 to or from the test board 100 or 100*a*.

The semiconductor package 20 that failed to pass the test is determined to be re-tested or repaired (S500). The determination may be made by analyzing the test result. For example, when a defect of the test board 100 or 100*a* is doubtful or the test result is unclear, a re-test may be performed. When a re-test is performed, as necessary, a test may be performed by replacing the test board 100 or 100*a*. When the rest result is that the semiconductor package 20 is to be repairable, the semiconductor package 20 is repaired (S600) and a re-test may be performed. In contrast, the semiconductor package 20 that is determined to be unrepairable or the semiconductor package 20 that failed to pass the re-test may be disposed of (S700). In some example embodiments, in the case of the semiconductor package 20 that failed to pass the re-test, the semiconductor package 20 may be repaired (S600) and then re-tested, or may be directly re-tested.

In the test method using the test system 1000 or 1000*a*, and a method of manufacturing a semiconductor package including the test method, according to the above example embodiments, because the size of equipment for a test is reduced and a space use efficiency for a test may be improved.

Also, because a test is performed by using the test board 100 or 100*a* capable of independently performing the test, the test on a relatively less number of the semiconductor packages 20 may be easily performed. For example, when the number of the semiconductor packages 20 that fail to pass a test and is to be re-tested is small, the test may be instantly performed without having to wait until more than a certain number of the semiconductor packages 20 to be tested are prepared. Accordingly, management of the semiconductor packages 20 that are subject to a test and/or retest may be made easy so that a time to manufacture and release the semiconductor packages 20 may be shortened.

For example, in the case of manufacturing a relatively small number of the semiconductor packages 20, a test may be performed with a reduced space for test equipment. Also, when a claim is raised for the semiconductor packages 20 that are already released to markets and the reason for the claim is analyzed, an independent test may be performed by using a small space.

In the specification, the term "unit" may be a hardware component like a processor or a circuit, and/or a software component executed by a hardware component like a processor.

While example embodiments have been particularly shown and described above, it will be understood that various changes in form and details may be made therein without departing from the spirit and scope of the following claims.

In the a test board for a semiconductor package, the test system, and the method of manufacturing a semiconductor package according to example embodiments, the wired connection to the external server and/or the power supply unit is not necessary and the handler for electrically connecting a plurality of DUTs to test equipment is not necessary, the size of test equipment may be reduced and thus a space use efficiency for a test may be increased.

Furthermore, because a test is performed by using a test board capable of independently performing the test, a test on a relatively less number of DUTs, that is, semiconductor packages, may be easily performed. Accordingly, management of semiconductor packages is facilitated and thus a time to manufacture and release semiconductor packages may be shortened.

Furthermore, when the reason for a defective semiconductor package is analyzed, an independent test may be performed by using a small space.

What is claimed is:

1. A test board comprising:
   a board substrate;
   a device under test (DUT) socket connected to the board substrate and configured to accommodate a semiconductor package;
   a test controller;
   a wireless signal unit configured to wirelessly exchange signals with a server; and
   a single wireless power unit configured to be wirelessly charged by an external source and configured to supply electric power to the test controller and the DUT socket,
   wherein the test controller is configured to independently perform a test on the semiconductor package accommodated in the DUT socket in response to a test pattern command being wirelessly received from the server via the wireless signal unit.

2. The test board of claim 1, wherein the test controller is attached to a first surface of the board substrate.

3. The test board of claim 1, wherein the wireless signal unit comprises a wireless signal transceiver that is attached to a first surface of the board substrate, and
wherein the single wireless power unit comprises:
a power receiver attached to a second surface opposite to the first surface of the board substrate; and
a power storage and supply unit configure to store and to supply the electric power received by the power receiver from the external source.

4. The test board of claim 1, wherein the test controller comprises:
a hardware processor;
a transceiver configured to communicate with the semiconductor package to be tested; and
an algorithmic pattern generator configured to convert the test pattern command to a signal to be applied to the semiconductor package.

5. The test board of claim 1, wherein the test controller comprises a Field Programmable Gate Array (FPGA).

6. The test board of claim 1, wherein the single wireless power unit is configured to supply electric power to the wireless signal unit.

7. A test system comprising:
a server; and
a plurality of test boards configured to wirelessly exchange signals with the server,
wherein each of the plurality of test boards comprises:
a single device under test (DUT) socket configured to accommodate a semiconductor package and configured to accommodate a single DUT, the single DUT attached on each of the plurality of test boards;
a test controller configured to independently perform a test on the semiconductor package accommodated in the DUT socket in response to a test pattern command being wirelessly received from the server; and
a wireless power unit configured to be wirelessly charged by an external source and configured to supply electric power to the test controller and the DUT socket.

8. The test system of claim 7, wherein each of the plurality of test boards is configured to independently and simultaneously perform the test on the semiconductor package accommodated in the single DUT socket.

9. The test system of claim 7, wherein the wireless power unit comprises:
a power receiver; and
a power storage and supply unit configured to store and to supply the electric power that the power receiver wirelessly received from the external source.

10. The test system of claim 9, wherein the external source comprises a power supply unit configured to wirelessly supply the electric power to the wireless power unit of each of the plurality of test boards.

11. The test system of claim 10, wherein the power supply unit is configured to wirelessly supply the electric power to the wireless power unit of each of the plurality of test boards while each of the plurality of test boards performs a test.

12. The test system of claim 10, wherein, before the semiconductor package is accommodated in the single DUT socket of each of the plurality of test boards, the power supply unit is configured to wirelessly supply the electric power to the wireless power unit of each of the plurality of test boards to charge the power storage and supply unit.

13. The test system of claim 10, further comprising a wireless signal unit configured to wirelessly exchange signals with the server,
wherein the wireless signal unit comprises a wireless signal transceiver attached to a first surface of a board substrate of the test board, and
wherein the power receiver is attached to a second surface opposite to the first surface of the board substrate.

14. The test system of claim 13, wherein the power storage and supply unit comprises a secondary battery, and
wherein the secondary battery of the power storage and supply unit is attached to the second surface of the board substrate.

15. The test system of claim 13, wherein the power storage and supply unit comprises a secondary battery, and
wherein the secondary battery of the power storage and supply unit is attached to the first surface of the board substrate.

16. A test system comprising:
a test board comprising:
a board substrate;
a wireless signal transceiver and a power storage and supply unit provided on a first side of the board substrate; and
a power receiver provided on a second side opposite of the first side of the board substrate; and
a power supply unit configured to charge the power storage and supply unit provided on the test board and comprising:
a power generator; and
a power transmitter,
wherein the test board is provided on the power transmitter.

17. The test system of claim 7 further comprises a connector attached to a side surface of a board substrate of the test board,
wherein the single DUT socket is connected to the connector.

18. The test system of claim 7, wherein each of the plurality of test boards further comprises a memory configured to store the test pattern command being wirelessly received from the server and a result of the test performed by the test controller.

19. The test system of claim 7, further comprising a device attachment/detachment apparatus configured to attach or detach the semiconductor package to be tested to or from the single DUT socket of each of the plurality of test boards.

20. The test system of claim 16, wherein the power transmitter comprises:
a first power transmitter; and
a second power transmitter,
wherein the test board comprises:
a first test board; and
a second test board,
wherein the first test board is provided on the first power transmitter and the second test board is provided on the second power transmitter, and
wherein the first power transmitter is stacked on the second power transmitter with an interval therebetween.

21. The test system of claim 20, wherein the interval between the first and second power transmitters is greater than a thickness of the test board.

22. The test system of claim 16, wherein the power supply unit is configured to wirelessly charge the power storage and supply unit.

* * * * *